United States Patent
Davis et al.

(10) Patent No.: US 12,352,136 B2
(45) Date of Patent: Jul. 8, 2025

(54) DOWNHOLE SAND CONTROL SCREEN SYSTEM

(71) Applicant: Chevron U.S.A. Inc., San Ramon, CA (US)

(72) Inventors: Jeremy Alexander Davis, Humble, TX (US); Antonio Lazo, Houston, TX (US); Reza Sarrafi-Nour, Clifton Park, NY (US); David Reuel Underdown, Conroe, TX (US)

(73) Assignee: CHEVRON U.S.A. INC., San Ramon, CA (US)

( * ) Notice: Subject to any disclaimer, the term of this patent is extended or adjusted under 35 U.S.C. 154(b) by 0 days.

(21) Appl. No.: 17/503,604

(22) Filed: Oct. 18, 2021

(65) Prior Publication Data

US 2022/0034202 A1 Feb. 3, 2022

Related U.S. Application Data

(62) Division of application No. 15/897,808, filed on Feb. 15, 2018, now Pat. No. 11,174,711.

(Continued)

(51) Int. Cl.
| | |
|---|---|
| *E21B 43/08* | (2006.01) |
| *C23C 16/04* | (2006.01) |
| *C23C 16/30* | (2006.01) |
| *C23C 16/32* | (2006.01) |
| *C23C 16/38* | (2006.01) |
| *C23C 18/16* | (2006.01) |

(52) U.S. Cl.
CPC ............ *E21B 43/084* (2013.01); *C23C 16/30* (2013.01); *C23C 16/32* (2013.01); *C23C 16/38* (2013.01); *C23C 18/1601* (2013.01); *E21B 43/086* (2013.01); *E21B 43/088* (2013.01); *C23C 16/045* (2013.01)

(58) Field of Classification Search
CPC ..... E21B 43/084; E21B 43/086; E21B 43/088
See application file for complete search history.

(56) References Cited

U.S. PATENT DOCUMENTS 1,520,376 A * 12/1924 Verneuil ............... E21B 43/084
166/230
3,347,317 A 10/1967 Zandmer
(Continued)

FOREIGN PATENT DOCUMENTS

| EP | 3037621 | 6/2016 |
| EP | 3660261 | 6/2020 |

(Continued)

OTHER PUBLICATIONS

Kumar, Deepak, et al., "Erosion Resistance of Sand Screens in Gas Wells", Paper presented at the SPE Asia Pacific Oil and Gas Conference and Exhibition, Brisbane, Australia, Oct. 2018. Paper No. SPE-192001-MS. pp. 1-2. Abstract Only.

(Continued)

*Primary Examiner* — Robert E Fuller
*Assistant Examiner* — Neel Girish Patel
(74) *Attorney, Agent, or Firm* — King & Spalding LLP

(57) ABSTRACT

System and method of non-line-of-sight coating of a sand screen for use in wellbores during the production of hydrocarbon fluids from subterranean formations. The coatings can have uniformly coated internal and external surfaces.

12 Claims, 3 Drawing Sheets

Related U.S. Application Data

(60) Provisional application No. 62/627,524, filed on Feb. 7, 2018, provisional application No. 62/460,130, filed on Feb. 17, 2017.

(56) References Cited

U.S. PATENT DOCUMENTS

| | | | |
|---|---|---|---|
| 3,347,701 A | 10/1967 | Yamagishi et al. | |
| 3,880,233 A * | 4/1975 | Muecke | E21B 43/045 |
| | | | 166/205 |
| 4,574,459 A * | 3/1986 | Peters | B28B 7/346 |
| | | | 425/464 |
| 4,665,305 A * | 5/1987 | Shirazawa | E21B 17/003 |
| | | | 166/60 |
| 4,811,790 A * | 3/1989 | Jennings, Jr. | B01D 39/2075 |
| | | | 166/278 |
| 5,350,545 A * | 9/1994 | Streckert | C04B 35/571 |
| | | | 264/29.7 |
| 6,237,780 B1 * | 5/2001 | Schulte | B07B 1/469 |
| | | | 210/489 |
| 6,799,645 B2 | 10/2004 | Mason et al. | |
| 8,176,995 B1 * | 5/2012 | Polsky | E21B 4/14 |
| | | | 173/78 |
| 8,220,563 B2 | 7/2012 | Bangaru et al. | |
| 8,261,841 B2 | 9/2012 | Bailey et al. | |
| 8,286,715 B2 | 10/2012 | Bailey et al. | |
| 8,464,793 B2 | 6/2013 | Scott et al. | |
| 8,800,657 B2 | 8/2014 | Mazyar et al. | |
| 9,267,360 B2 | 2/2016 | Krush et al. | |
| 10,934,785 B2 | 3/2021 | Fripp et al. | |
| 2010/0044040 A1 | 2/2010 | Parlar et al. | |
| 2010/0258302 A1 | 10/2010 | Bonner et al. | |
| 2011/0042069 A1 * | 2/2011 | Bailey | E21B 17/1085 |
| | | | 166/243 |
| 2011/0042100 A1 * | 2/2011 | O'Neal | E21B 21/103 |
| | | | 166/373 |
| 2011/0220348 A1 * | 9/2011 | Jin | E21B 41/00 |
| | | | 166/244.1 |
| 2012/0034377 A1 * | 2/2012 | Hailey, Jr. | E21B 43/04 |
| | | | 427/244 |
| 2012/0073801 A1 * | 3/2012 | Greci | E21B 43/088 |
| | | | 166/227 |
| 2012/0267172 A1 * | 10/2012 | DiGiovanni | F16C 33/043 |
| | | | 175/428 |
| 2013/0264072 A1 | 10/2013 | Lopez et al. | |
| 2014/0116727 A1 * | 5/2014 | Cunningham | E21B 43/08 |
| | | | 166/227 |
| 2014/0158295 A1 * | 6/2014 | Badrak | E21B 43/088 |
| | | | 427/249.1 |
| 2014/0287161 A1 | 9/2014 | Ertas et al. | |
| 2014/0311756 A1 * | 10/2014 | Dicke | C23C 12/00 |
| | | | 427/236 |
| 2015/0013970 A1 * | 1/2015 | Jaaskelainen | E21B 47/07 |
| | | | 166/250.01 |
| 2015/0027701 A1 * | 1/2015 | Panamarathupalayam | |
| | | | E21B 43/08 |
| | | | 166/278 |
| 2015/0083325 A1 | 3/2015 | Kitamura et al. | |
| 2015/0132539 A1 * | 5/2015 | Bailey | C23C 28/042 |
| | | | 427/523 |
| 2015/0152716 A1 | 6/2015 | Kim et al. | |
| 2015/0211341 A1 | 7/2015 | Least et al. | |
| 2015/0218901 A1 | 8/2015 | Juhlin et al. | |
| 2015/0240146 A1 * | 8/2015 | Sista | C09K 8/52 |
| | | | 428/335 |
| 2015/0240606 A1 | 8/2015 | Dowsett et al. | |
| 2015/0375144 A1 | 12/2015 | Greci | |
| 2015/0376983 A1 | 12/2015 | Greci | |
| 2015/0376990 A1 | 12/2015 | Bonner | |
| 2016/0010425 A1 | 1/2016 | Dyck | |
| 2016/0024895 A1 * | 1/2016 | Russell | B01D 39/12 |
| | | | 29/446 |
| 2016/0102532 A1 | 4/2016 | Gillespie et al. | |
| 2016/0136928 A1 | 5/2016 | Zhao et al. | |
| 2016/0160615 A1 | 6/2016 | Greci et al. | |
| 2016/0206978 A1 | 7/2016 | Kenney et al. | |
| 2016/0326850 A1 | 11/2016 | Hailey, Jr. | |
| 2016/0369602 A1 | 12/2016 | Frosell | |
| 2017/0145796 A1 | 5/2017 | Lejeune | |
| 2017/0211359 A1 * | 7/2017 | Kumar | E21B 43/08 |
| 2017/0211361 A1 | 7/2017 | Reid et al. | |
| 2017/0298711 A1 | 10/2017 | Aitken et al. | |
| 2018/0038206 A1 * | 2/2018 | Banerjee | C09D 127/18 |
| 2018/0238150 A1 * | 8/2018 | Davis | E21B 43/088 |
| 2018/0266219 A1 | 9/2018 | Coffin et al. | |
| 2018/0334607 A1 | 11/2018 | Paxson et al. | |
| 2018/0371878 A1 | 12/2018 | Coffin et al. | |

FOREIGN PATENT DOCUMENTS

| | | | | |
|---|---|---|---|---|
| WO | WO 2015/110807 | | 7/2015 | |
| WO | WO-2015110807 A2 * | | 7/2015 | E21B 17/1078 |

OTHER PUBLICATIONS

Weatherford Sand Screen Selector brochure, 2010-2012, pp. 1-7.
AEI Blog: Stairs, David, "Comparing 3 Types of Screening Equipment". Aggregates Equipment, Inc., 2017, pp. 1-4.

* cited by examiner

DOWNHOLE SAND CONTROL SCREEN SYSTEM

CROSS REFERENCE TO RELATED APPLICATIONS

The present application is a divisional application of U.S. application Ser. No. 15/897,808, filed Feb. 15, 2018, and titled "Methods of Coating a Sand Screen Component," which claims priority to U.S. Provisional Patent Application No. 62/460,130, filed Feb. 17, 2017, and titled "Sand Control Screen Assemblies and Associated Methods of Manufacturing," and to U.S. Provisional Patent Application No. 62/627,524, filed Feb. 7, 2018, and titled "Sand Control Screen Assemblies and Associated Methods of Manufacturing." The entire contents of the foregoing applications are hereby incorporated herein by reference.

TECHNICAL FIELD

The present application relates generally to structures adapted for filtering particulates from a flowing fluid in a wellbore that traverse a subterranean hydrocarbon bearing formation, and in particular, to methods of manufacturing erosion resistant drainage layers and/or filter media for sand control screen assemblies.

BACKGROUND

Sand exclusion screen assemblies are employed in wellbores during the production of hydrocarbon fluids from subterranean formations. Conventional sand screen assemblies include a perforated base pipe, a drainage layer, a filter medium, and a protective jacket or shroud. Such screen assemblies are designed to filter out particles, such as formation sand or placed gravel/proppant, while facilitating the passage of hydrocarbon fluids into the wellbore. One drawback in the deployment of such screen assemblies is the erosion of the drainage layer and/or filter medium by impingement of particles contained in the fluids that pass through the screen assemblies. The presence of particulate in the flow stream can cause erosion. When the drainage layer and/or filter medium become eroded, then particles are produced from the well, which is highly undesirable. Production of these particles can cause excessive erosion of production tubulars, downhole equipment and surface equipment, and lead to high maintenance costs and undesirable downtime of wells.

Initial testing of coated drainage layers and/or filter media with an erosion resistant material has shown that erosion performance may be improved. Currently researched methods of manufacturing coated screen assembly components include coating using line-of-sight processes, such as physical vapor deposition (PVD) processes (e.g. plasma glow discharge process, electron ionization process, ion source process, and magnetron sputtering process) and thermal spraying processes (e.g. plasma spraying process, detonation spraying process, wire arc spraying process, arc spraying process, flame spraying process, and high velocity oxy fuel spraying process). However, these line-of-sight processes are deficient in that they are unable to coat the inner portions of the tubular sand screen component, as well as the inner portions of the mesh or wire layer of the drainage layer and/or filter medium.

Accordingly, a need has arisen for an improved method of manufacturing a drainage layer and/or filter medium for a sand control screen assembly that is capable of filtering particles out of a production stream from a subterranean hydrocarbon bearing formation and that does not readily suffer from erosion.

SUMMARY

The present application relates generally to structures adapted for filtering particulates from a flowing fluid in a wellbore that traverse a subterranean hydrocarbon bearing formation, and in particular, to methods of manufacturing erosion resistant drainage layers and/or filter media for sand control screen assemblies.

A general embodiment of the disclosure is a method of coating a sand screen component comprising: applying a coating to the sand screen component using a non-line-of-sight coating process, wherein, once coated, an interior surface and an exterior surface of the sand screen component have a coating thickness of between 5 and 100 microns. In certain embodiments, the coating is uniformly applied to the sand screen component such that the coating thickness on the interior surface, the exterior surface, and a contour surface of the sand screen component are all within 20 microns of each other. The sand screen component can be one or more components selected from the group consisting of: perforated base pipes, drainage layers, filter media, and protective jackets, for example. In specific embodiments, the filter media is selected from the group consisting of: single-layer mesh screens, multilayer mesh screens, wire-wrapped screens, and slotted liners. The coating can comprise one or a combination of hard carbide, boride, nitride, carbo-nitride and silicide phases. In specific embodiments, the hardness of the coating is between 1200 vickers and 5000 vickers and/or the coating is acid resistant. In some embodiments, the non-line-of-sight coating process is selected from the group consisting of: chemical vapor deposition, chemical vapor infiltration, bath deposition, and reacting the base structure with reactive vapor or liquid species. The sand screen component can comprise carbon steel, 316LSS, Alloy 20, and/or Inconel 825, for example.

Another general embodiment is a downhole system comprising: a wellbore; a sand screen placed within the wellbore, wherein the sand screen comprises a component, the component comprising an interior surface and an exterior surface, and wherein the component is coated with a coating such that the coating on the interior surface and the exterior surface has a coating thickness of between 5 and 100 microns. In certain embodiments, the coating is uniform such that the coating thickness on the interior surface, the exterior surface, and a contour surface of the component are all within 20 microns of each other. The component can be one or more components selected from the group consisting of: perforated base pipes, drainage layers, filter media, and protective jackets, for example. In some embodiments, the filter media is selected from the group consisting of: single-layer mesh screens, multilayer mesh screens, wire-wrapped screens, and slotted liners. The coating can comprise one or a combination of hard carbide, boride, nitride, carbo-nitride and silicide phases. In some embodiments, the hardness of the coating is between 1200 vickers and 5000 vickers and/or the coating can be acid resistant. The sand screen component can comprise carbon steel, 316LSS, Alloy 20, and/or Inconel 825, for example.

DESCRIPTION OF THE EXAMPLE EMBODIMENTS

Figure 1:
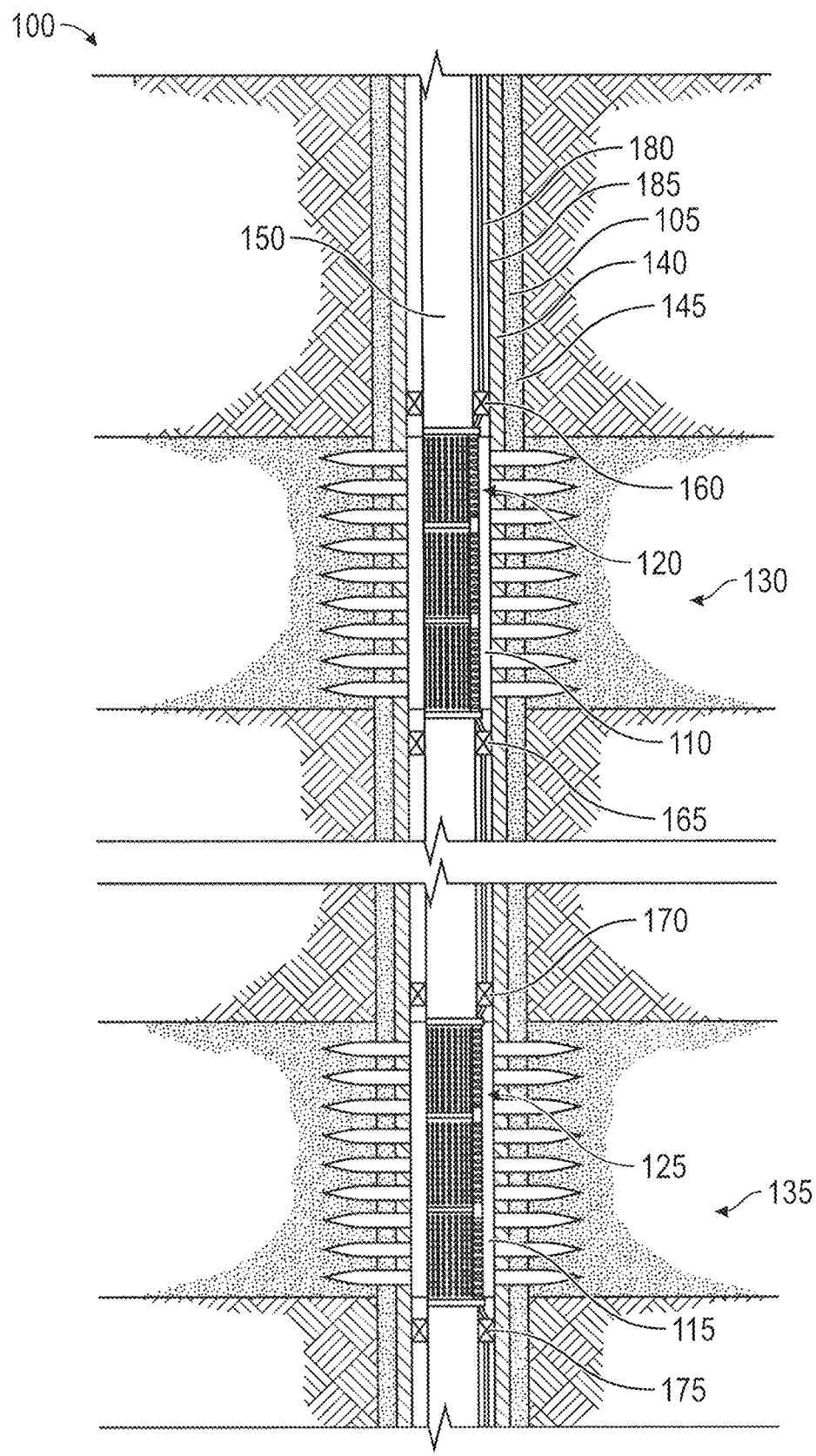
FIG. 1 is a schematic illustration of a wellbore environment including a pair of sand control screen assemblies, according to an embodiment of the present disclosure.

The present application provides sand control screen assemblies that are more resistant to erosion than conventional sand control screen assemblies. By limiting erosion loss, it is not required to reduce the rate of oil and gas production, which is common in instances of sand screen erosion.

The disclosure may be better understood by reading the following description of non-limiting, exemplary embodiments with reference to the attached drawings, wherein like parts of each of the figures are identified by the same reference characters. In the following description of the representative embodiments of the invention, directional terms, such as "above", "below", "upper", "lower", "inner", "outer", "top", "bottom", etc., are used for convenience in referring to the accompanying drawings. In general, "above", "upper", "upward" and similar terms refer to a direction toward the earth's surface along a wellbore, and "below", "lower", "downward" and similar terms refer to a direction away from the earth's surface along the wellbore towards the bottom of the well.

Referring to FIG. 1, illustrated is a wellbore system 100 that may employ the principles of the present disclosure, according to one or more embodiments of the disclosure. As depicted, the wellbore system 100 includes a wellbore 105 having production intervals 110, 115, having sand control screen assemblies 120, 125, respectively, positioned therein. The wellbore 105 extends through various formations 130, 135 in the earth strata. A casing 140 is supported within wellbore 105 by cement 145. A production or completion string 150 includes various tools, such as sand control screen assembly 120 that is positioned within production interval 110 between packers 160, 165. In addition, the production or completion string 150 includes a sand control screen assembly 125 that is positioned within production interval 115 between packers 170, 175. The sand control screen assemblies 120, 125 serve the primary functions of filtering particulate matter out of the production fluid stream and may also include flow control capabilities or other additional functionality. One or more control lines 180 may extend from a ground surface within annulus 185 and pass through sand control screen assemblies 120, 125 to provide instructions, carry power, signals and data, and transport operating fluid, such as hydraulic fluid, to sensors, actuators and the like associated with sand control screen assemblies 120, 125 and other tools or components positioned downhole. Sensors (not shown) operably associated with production or completion string 150 may be used to provide valuable information to the operator via control line 180 during the production phase of the well, such as fluid temperature, pressure, velocity, constituent composition and the like, such that the operator can enhance the production operations.

Even though FIG. 1 depicts sand control screen assemblies 120, 125 in a cased hole environment, one skilled in the art will recognize that the sand control screen assemblies of the present invention are equally well suited for use in open hole environments. Also, even though FIG. 1 depicts a vertical completion, one skilled in the art will recognize that the sand control screen assemblies of the present invention are equally well suited for use in wells having other directional configurations including horizontal wells, deviated wells, multilateral wells, and the like.

Figure 2A:
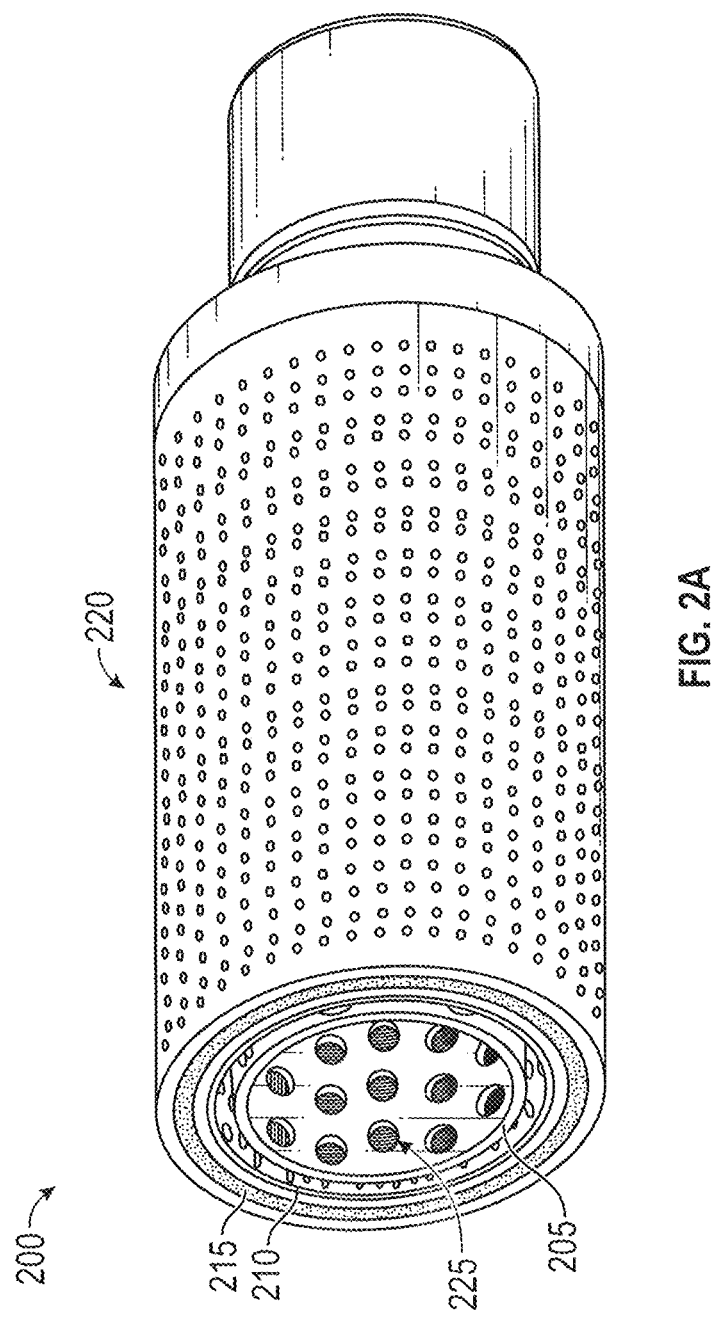
FIG. 2A is a top perspective view of a sand control screen assembly, according to an embodiment of the present disclosure.
Figure 2B:
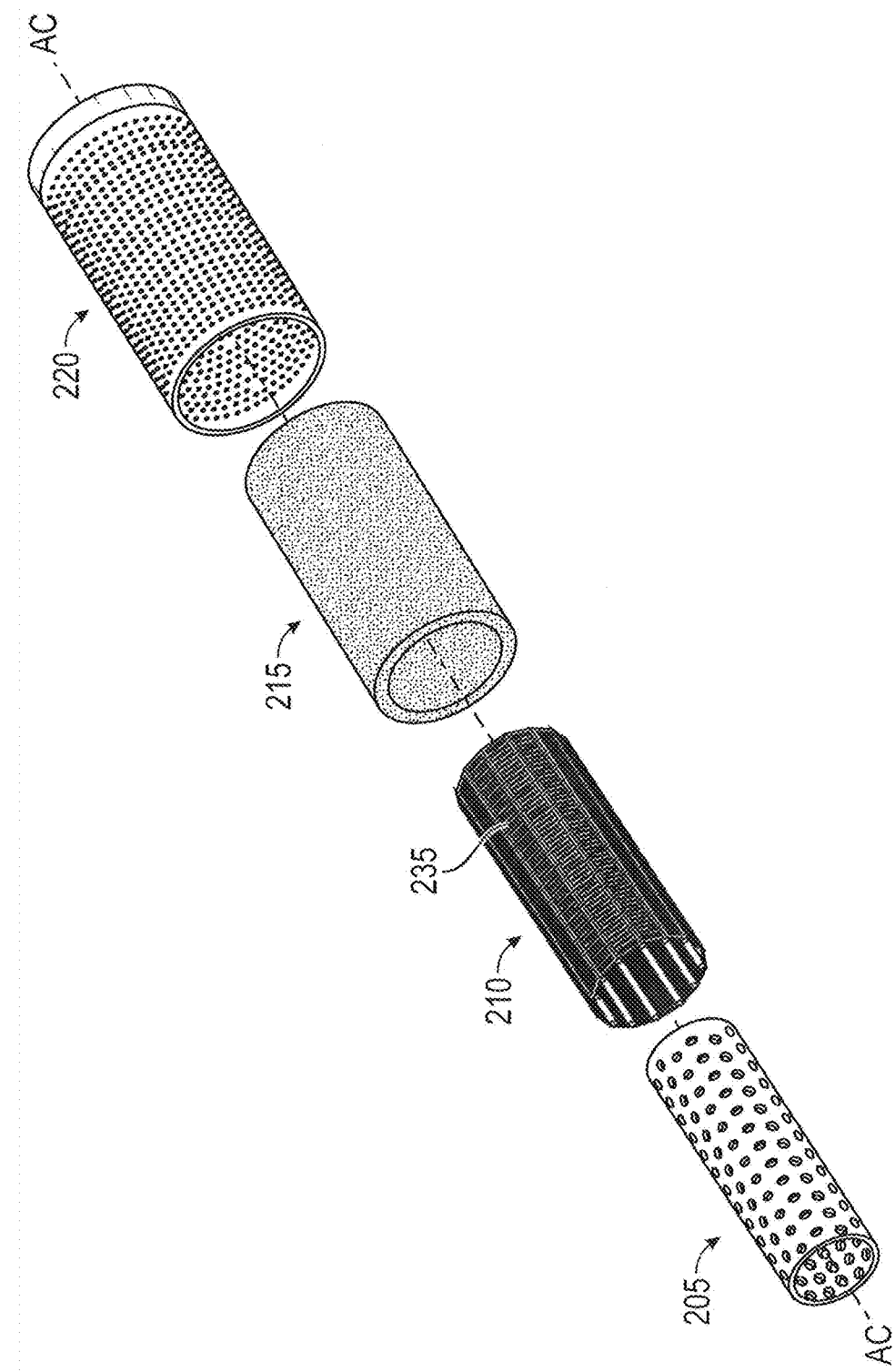
FIG. 2B is an exploded view of the sand control screen assembly of FIG. 2A, according to an embodiment of the present disclosure.

FIGS. 2A-2B illustrate an exemplary embodiment of a sand control screen assembly 200 for use in wellbore 105 (FIG. 1). Along with the other sand control screen assemblies described in the present application, the sand control screen assembly 200 may replace one or more of the screen assemblies 120, 125 described in FIG. 1 and may otherwise be used in the exemplary wellbore system 100 depicted therein. Any component within a sand screen is referred to herein as a sand screen component. Sand screen components can include a perforated base pipe, a filter medium, a protective jacket or shroud, as well as any material used to hold such sand screen components together or to each other, for example.

The screen assembly 200 generally includes a perforated base pipe 205, a drainage layer 210, a filter medium 215, and a protective jacket or shroud 220. Generally, during hydrocarbon production, fluid from the subterranean formation flows in a direction from the formation, through the shroud 220, and towards a central axis AC of the base pipe 205. The base pipe 205 provides structural support to the assembly 200, and also provides flow communication via openings 225 with the production or completion string 150 (FIG. 1) in the wellbore 105.

The drainage layer 210 occasionally is a slotted screen and includes a plurality of ribs 235 that are substantially symmetrically disposed or positioned about the central axis AC of the base pipe 205. In certain embodiments, the slotted screen is made up of wrapped wires. The drainage layer 210 is placed around the surface of the base pipe 205 and typically distributes inflow to the base pipe 205. In certain embodiments, the drainage layer 210, composed of the slotted screen and the plurality of ribs 235, can be replaced by other porous structures such as metal meshes. Generally, the drainage layer 210 may be a two or three-dimensional mesh, wire, or porous structure. In certain exemplary embodiments, the drainage layer 210 is coated, as described in further detail below. In some embodiments, the drainage layer is a slotted screen, as described.

The filter medium 215 that surrounds the drainage layer 210 is utilized for particle control and/or particle filtration of a predetermined size. In certain exemplary embodiments, the filter medium 215 is a woven mesh liner, for example, a single-layer mesh screen, or a multilayer mesh screen such as 2-layer, 4-layer, 6-layer, or 8-layer premium mesh. In alternate embodiments, the filter medium 215 can be a wire-wrapped or slotted liner. Generally, the filter medium 215 may be a two or three-dimensional mesh, wire, or porous structure. In certain exemplary embodiments, the filter medium 215 is coated, as described in further detail below.

The shroud 220 surrounds the filter medium 215 and provides protection to the assembly 200 during installation. In certain exemplary embodiments, the shroud 220 is a perforated jacket. In alternative embodiments, the shroud 220 may be a wire-wrapped jacket, a slotted screen jacket, or a stamped jacket.

In the present disclosure, a sand control screen assembly may include a layer of coating deposited on all internal surfaces and external surfaces of a drainage layer and/or filter medium of the assembly. The presence of this layer of coating may reduce the erosion wear rate on the drainage layer and/or filter medium due to flow of an erosive, corrosive, and/or erosive corrosive fluid. In certain exemplary embodiments, the properties of the deposited/coated layer, such as hardness, toughness, chemical bonding strength, and coverage may improve the erosion resistance and structural stability of the drainage layer and/or filter medium over conventional coated screens.

The application of the deposited/coated layer onto the drainage layer and/or filter medium is generally performed by non-line-of-sight processes, such as chemical vapor deposition (CVD), chemical vapor infiltration (CVI), bath deposition, or by reacting the base structure with reactive vapor or liquid species such as reactive infiltration (RI). These processes differ from line-of-sight processes such as physical vapor deposition (PVD) or thermal spraying in that non-line-of-sight processes are generally able to uniformly coat complex geometries within a layered tubular section such as a drainage layer or filter medium of a sand control screen assembly. These non-line-of-sight processes may result in both increased bonding and formation of a hard, corrosion and erosion resistant surface layer on the complex geometry of the screen components. When applied to a two or three-dimensional screen frame, the resulting structure has both increased bonding and continuity, and improved erosion resistance due to formation of hard, corrosion and erosion resistant surface layers on the screen. Sand screen components may be made from any standard material. In some embodiments, the sand screen component is comprised of 316LSS, Alloy 20, Inconel 825, carbon steel, or combinations thereof.

In certain exemplary embodiments, the deposited or infiltrated layer may include a hard carbide, boride, nitride, carbo-nitride and silicide phases such as titanium carbide, titanium nitride, tungsten carbide, titanium di-boride, iron boride, nickel boride, silicon carbide, boron carbide, molybdenum boride, and the like, and combinations thereof. The resulting screen structure poses enhanced erosion and structural properties that can extend both the service life and performance of the sand control screen assembly in completion environments where exposure to fluids that are either corrosive or contain hard, erosive, solid particulates, or a combination of both corrosive and erosive fluids are generally unavoidable. The screen structures will also be uniformly coated on all exterior surfaces, interior surfaces, and curved or contoured surfaces using the non-line-of-sight processes described herein. Additionally, in embodiments, the coating contours directly with the wires without buildup at intersections. Generally, bead tests can demonstrate the maximum particle size allowed through the screen structures, which will confirm that the coating process did not alter the screen open area outside of specified limits. In some embodiments, coating thickness is in the range of 5 to 100 microns for a balance between erosion performance and maintaining aperture open area/functionality, and/or influenced by the ductility of the coating material and the ability to withstand stresses internal to the coating layer. For instance, in certain exemplary embodiments, the coating layer has a thickness in a range from about 5 microns to 50 microns. In certain exemplary embodiments, the coating layer has a thickness in the range of from about 50 microns to about 85 microns, or about 30 microns to about 60 microns, or about 20 microns to about 45 microns, or about 15 microns to about 35 microns, or about 10 microns to about 25 microns. In certain exemplary embodiments, the coating layer has a thickness of about 30 microns. In certain exemplary embodiments, the coating layer has a thickness of about 25 microns. In some embodiments, the coating layer is uniform across the entirety of the material coated (interior and exterior surfaces), and the thickness varies only within +/−5 microns, +/−10 microns, +/−15 microns, or +/−20 microns. In certain embodiments, the coating has a hardness in the range from about 1200 vickers to about 5000 vickers, such as between 1200-1500, 1500-2000, 2000-2500, 2500-3000, 3000-3500, 3500-4000, 4000-4500, 4500-5000, 1200-2000, 2000-3000, 3000-4000, 4000-5000, 1200-2500, 2500-5000 vickers, for example. Initially, a softer or more elastic material was thought to perhaps perform better because a softer material can cushion a collision from a particle. Surprisingly, however, softer material was determined to be an unacceptable coating material and broke down faster than the harder coating. In some embodiments, the coating is acid resistant. For example, when exposed to acid for 200 hours, the component and the coating may lose less than 5 percent, or a negligible amount, of the original weight of the component and the coating. In some embodiments, the coating is heat resistant to typical wellbore temperatures, for instance, about 250° F. or greater. In certain exemplary embodiments, the coating is heat resistant to typical weld stress relieving temperatures, for instance, at least 800° F. In some embodiments, the coating is adhesion tested per accepted industry standards.

Methods of the present disclosure include methods of manufacturing a coated tubular screen structure, such as a drainage layer or filter medium of a sand control screen assembly. In some embodiments, a wire wrap or mesh screen is fabricated and rolled into the necessary diameter for the target well application. In addition, the length of the tubular is at a dimension that is required to fit into the coating/surface treatment chamber of choice. In embodiments, these tubulars are coated with a material described above using a non-line-of-sight process, and then evaluated for quality before welding together segments to achieve the ultimate required screen joint length. The welded screen assembly is then welded onto a base pipe and a protective shroud is placed over the assembly, for example.

Example

Eight different coatings were erosion loop tested against an uncoated sample. The erosion loop comprised a flow loop that used an erosive slurry of highly angular aluminum oxide particles in water. Four of the coatings were deposited by line of sight processes, either physical vapor deposition or liquid based spray: chromium titanium nitride (Cr/TiN), chromium carbide/diamond (Cr/CrC/Diamond), titanium aluminum nitride (TiAlN), and diamond like carbon (DLC). The other four were deposited by non-line-of-sight processes, specifically chemical vapor deposition or bath deposition: tungsten carbide, boronization, nickel/diamond, and hard chrome. 1.5" diameter flat screen coupons covered in each type of coating were used to test the erosion performance. The test parameters were optimized to achieve a harsh accelerated test while ensuring the particle to particle interaction/impacts were minimal. Rates for all coating samples were adjusted within the flow loop to target the same velocity through the screen for all alternatives. This verifies an apples to apples comparison as the particle velocity is a key variable for erosion on these tests. The grit particles were replaced at the end of each day to ensure the particles did not dull and affect the erosion rate over the duration of the testing. The reduction of the erosion rate for coated screens was then compared to the uncoated screen. For the majority, the non-line-of-sight coatings outperformed the uncoated and the line-of-sight coatings. The test results indicated that the non-line-of-sight coatings, boronization and tungsten carbide, performed with erosion life extension of 2× to 4× compared to the uncoated coupon.

The coatings were tested for uniformity, adhesion, toughness, and heat resistance. The non-line-of-sight coatings were applied uniformly and contoured with the substrate geometry without buildup. Sand screen efficiency testing demonstrated the non-line-of-sight coated screens performed well and allowed for proper screen size selection, considering the additional coating thickness. The non-line-of-sight coatings were also tested for acid resistance in comparison to uncoated samples. An aggressive acid formulation was selected with a duration of testing determined to cover a worst case over the life of a well. The non-line-of-sight coatings demonstrated improved performance over uncoated samples.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. A downhole system comprising:
    a wellbore;
    a sand screen placed within the wellbore, wherein the sand screen comprises a cylindrical woven mesh, the cylindrical woven mesh comprising an interior surface and an exterior surface, and wherein the cylindrical woven mesh is coated with a coating such that the coating on the interior surface and the exterior surface has a coating thickness of between 5 and 100 microns, wherein the coating is uniform such that the coating thickness on the interior surface, the exterior surface, and a contour surface of the cylindrical woven mesh are all within 20 microns of each other,
    wherein the coating comprises an infiltrated layer that is one or a combination of carbide, boride, nitride, carbonitride and silicide phases and the coating is formed by a chemical vapor infiltration process, and
    wherein the coating is acid resistant and heat resistant to 800° F.

2. The downhole system of claim 1, wherein the cylindrical woven mesh is one of: a perforated base pipe, a drainage layer, a filter media, and a protective jacket.

3. The downhole system of claim 2, wherein the filter media is selected from the group consisting of: single-layer mesh screens, multilayer mesh screens, wire-wrapped screens, and slotted liners.

4. The downhole system of claim 3, wherein the multilayer mesh screen is a 2-layer, 4-layer, 6-layer, or 8-layer mesh screen.

5. The downhole system of claim 1, wherein a hardness of the coating is between 2500 Vickers and 5000 Vickers.

6. The downhole system of claim 1, wherein the cylindrical woven mesh comprises carbon steel.

7. The downhole system of claim 1, wherein the infiltrated layer of the coating is titanium carbide, titanium nitride, tungsten carbide, titanium di-boride, iron boride, nickel boride, silicon carbide, boron carbide, molybdenum boride, or a mixture thereof.

8. The downhole system of claim 7, wherein the infiltrated layer of the coating comprises tungsten carbide.

9. The downhole system of claim 1, wherein the coating thickness is in a range from about 5 microns to 50 microns.

10. The downhole system of claim 1, wherein the coating thickness varies by no more than +/−15 microns.

11. The downhole system of claim 1, wherein the coating thickness varies by no more than +/−10 microns.

12. The downhole system of claim 1, wherein the coating thickness varies by no more than +/−5 microns.

* * * * *